United States Patent [19]

Arakawa et al.

[11] Patent Number: 4,695,801
[45] Date of Patent: Sep. 22, 1987

[54] MATCHED QUADRATURE COILS FOR MRI WITH MINIMIZED INTERCOIL COUPLING

[75] Inventors: Mitsuaki Arakawa, Hillsborough; John H. Fehn, El Sobrante; Lawrence E. Crooks, Richmond, all of Calif.

[73] Assignee: The Regents of the University of California, Berkeley, Calif.

[21] Appl. No.: 827,609

[22] Filed: Feb. 10, 1986

[51] Int. Cl.[4] ............................................. G01R 33/20
[52] U.S. Cl. ...................................... 324/318; 324/309; 324/322; 336/223; 333/24 C
[58] Field of Search ........................ 324/318, 322, 309; 333/219, 24 R, 24 C, 32; 336/223, 225

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,471,305 | 9/1984 | Crooks et al. | 324/309 |
| 4,607,225 | 8/1986 | Crooks | 324/318 |

FOREIGN PATENT DOCUMENTS

| | | | |
|---|---|---|---|
| 2227725 | 1/1973 | Fed. Rep. of Germany | 324/318 |
| 2161940 | 1/1986 | United Kingdom | 324/318 |

OTHER PUBLICATIONS

"Quadrature Detection Coils-A Further √2 Improvement in Sensitivity" by Chen et al, J. Mag. Res. 54, 324–327 (1983).
"Quadrature Detection in the Laboratory Frame" by Hoult et al, Mag. Res. Med. 1 339–353 (1984).
"A Quadrature Probe for Adult Head NMR Imaging" by Sank et al, Department of Radiology, NIH, pp. 650–641; by Feb. 1986.
"Radio Frequency Penetration Effects in MR Imaging: Simulation/Experiment with Linearly Polarized and Circularly Polarized RF Fields" by Glover et al, GE Medical Systems, pp 264—265; by Feb. 1986.
"An in vivo NMR Probe Circuit for Improved Sensitivity" by Murphy-Boesch et al, J. Mag. Res. 54, 526-532 (1983).

Primary Examiner—Tom Noland
Attorney, Agent, or Firm—Nixon & Vanderhye

[57] ABSTRACT

First and second co-located axially extending RF coils are displaced spatially with respect to one another by 90 degrees so as to produce a pair of RF signals from the enclosed volume which are in phase quadrature. The same coils or one of them may also be utilized for transmitting NMR RF signals into the same volume. The coils have a common open-end through which objects to be imaged may be inserted and a common "closed" end for convenient location of RF coupling and feeding structures. Each of the coils has an RF feedline structure which extends across a diameter of common closed end and the two-feedline structures are disposed substantially perpendicular with respect to one another so as to minimize cross coupling. The feedlines are also spatially configured to facilitate mounting of associated tuning and coupling capacitors. A fixed coupling "paddle" provides cancellation coupling between the coils and a movably mounted coupling paddle is arranged to provide variable amounts of cancellation coupling between the orthogonal feedline structures. The phase quadrature RF signals emanating from the pair of coils are preferably amplified before being combined in a 90° RF hybrid circuit.

15 Claims, 7 Drawing Figures

COIL-I-
(COIL Q IDENTICAL BUT
SPATIALLY ROTATED BY 90°)

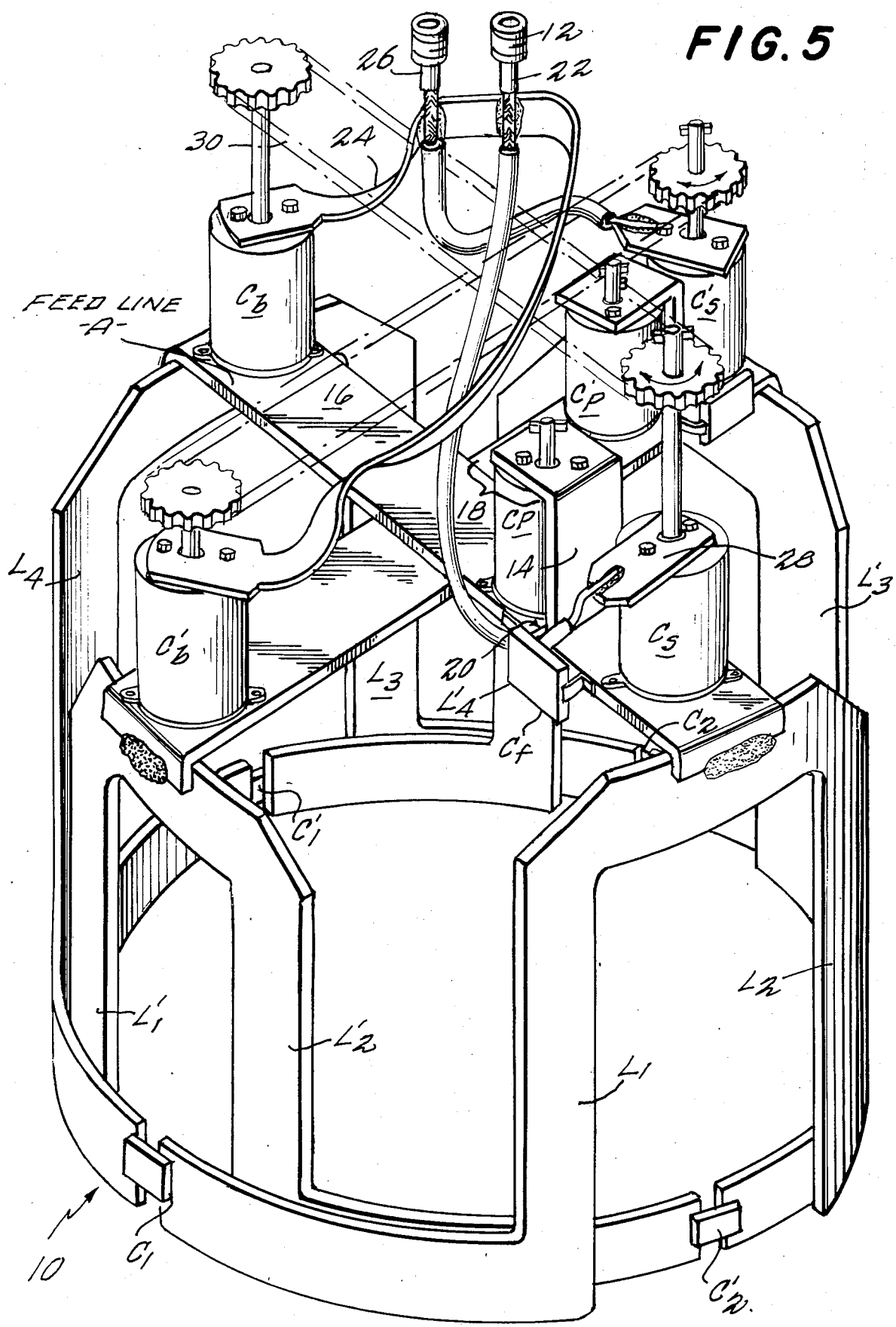

MATCHED QUADRATURE COILS FOR MRI WITH MINIMIZED INTERCOIL COUPLING

This invention is related to the field of magnetic resonance imaging (MRI) utilizing nuclear magnetic resonance (NMR) phenomena. It is particularly related to an advantageous quadrature RF coil for such an apparatus and to its "front end" RF section which couples the RF transmit/receive coil to RF transmitting and receiving circuits.

CROSS-REFERENCES TO RELATED APPLICATIONS

This application is generally related to earlier filed, commonly assigned, patents and applications of Crooks et al including U.S. Pat. Nos. 4,297,637; 4,318,043; 4,471,305; pending application Ser. No. 515,117 filed July 19, 1983 (now U.S. Pat. No. 4,599,565) and the pending application to Crooks Ser. No. 515,116 (now U.S. Pat. No. 4,607,225) filed July 19, 1983. The contents of these referenced related patents and/or patent applications is hereby incorporated by reference.

BACKGROUND OF THE INVENTION

Magnetic resonance imaging (MRI) is now coming into wide-spread commercial usage. Nevertheless, there are still many possible areas for improvement. For example, desired improvements are still sought to improve the signal-to-noise ratio in NMR responses and, accordingly, in resulting NMR images.

One previously known technique for improving the attainable signal-to-noise ratio involves the use of quadrature RF transmit/receive coils. For example, a general description of such quadrature RF coils and of the potential benefits to be derived from use of same is provided in the following prior publications:

"Quadrature Detection Coils—A Further $\sqrt{2}$ Improvement in Sensitivity" by Chen et al, J. Mag. Res. 54, 324–327 (1983)

"Quadrature Detection in the Laboratory Frame" by Hoult et al, Mag. Res. Med. 1 339–353 (1984)

"A Quadrature Probe For Adult Head NMR Imaging" by Sank et al, Department of Radiology, NIH, pp 650–651

"Radio Frequency Penetration Effects in MR Imaging: Simulation/Experiment with Linearly Polarized and Circularly Polarized RF Fields" by Glover et al, GE Medical Systems, pp 264–265.

These prior publications describe a pair of matched quadrature RF coils wherein each coil includes four axially extending legs disposed at 60°, 120°, 60° and 120° spacing about a common cylinder—with one coil being rotated by 90° spatially with respect to the other. The phase quadrature outputs from the two separate coils are subsequently combined in a 90° hybrid so as to produce an output having increased signal-to-noise ratio (e.g., because the non-coherent noise will tend to cancel when the two signals are coherently added with an appropriate 90° phase shift in one of them). As is also noted in these references, one or both of the coils may be advantageously utilized for transmitting RF NMR excitation pulses into the enclosed volume to be imaged so as to further enhance the attainable signal-to-noise ratio and/or so as to reduce the required level of transmitted RF power.

Ideally, there should be no inductive coupling between the two RF quadrature coils. In reality, there is always inherently some spurious coupling. Nevertheless, the effective isolation between the two coils can be improved by purposefully adding some additional coupling between the coils of the proper amplitude and phase to cancel (or at least substantially reduce) the unwanted but inherent spurious inter-coil coupling. It is apparently for this purpose that the prior art has employed conductive areas (termed "paddles") between some sections of the coil legs.

Although the general theory of quadrature detection coils is known in the prior art, the successful realization of a commercially reproducible working embodiment of such a system with minimum coupling between the coils, an RF balanced coil structure—and one which is nevertheless configured spatially in a manner which facilitates not only manufacture but actual use—remains as a difficult task.

Some prior approaches have employed coil structures having both ends of the coil structure open-ended and with axially extending feedlines emanating from opposite ends of the overall structure and respectively associated with each of the two coils.

SUMMARY OF THE INVENTION

We have discovered an improved and novel structure for a quadrature RF coil arrangement in an MRI apparatus which provides very good isolation between the two coils even though only one end of the coil is open-ended (e.g., so as to accept a head or other object to be imaged) while the other end of the structure is "closed" for convenient location of RF coupling and feeding structures. This novel arrangement includes a special perpendicular arrangement of respectively associated RF feedline structures extending across perpendicular diameters of the common closed end. Pairs of coil legs in each of the coil structures are capacitively coupled together at the open end and conductively coupled together at the closed end (where they are conductively coupled to a respectively associated one of the perpendicular feedline structures).

The leg sections of the coils and the perpendicular RF feedline structures are all made from strips of thin conductive sheet material. The RF feedline for each coil includes a first section shaped to include an axially off-set portion which mates with the terminating end of a second section, extending from the other side of the coil structure, such that a tuning capacitor can be conveniently connected between the first and second sections at the axially off-set area. The perpendicular arrangement of such feedline structures also facilitates the mounting of first and second series coupling capacitors mounted to respectively symmetric portions of the first and second sections of each feedline with RF transmission line (e.g., the outer and inner conductors of a coaxial cable) being connected to the other ends of the first and second series coupling capacitors.

A fixed cancellation-coupling "paddle" is employed for purposes similar to that in the prior art—however, we have found it advantageous to employ an apertured fixed paddle which at least partially actually overlies the coil legs from two different coils. In addition, a movably mounted cancellation-coupling paddle is inductively coupled to both feedline structures and movable with respect to them so as to vary the amount of cancellation coupling needed to cancel spurious coupling between the two perpendicular feedline and/or coil structures.

A further feature of this invention involves the use of RF preamplifiers (preferably of the conventional low noise variety) to amplify received RF signals before they are input to a conventional 90 degree RF hybrid circuit (connected to combine outputs from the first and second amplifiers into a common RF output which is, in turn, then provided to a conventional MRI receiver/processor so as to produce an image of the object located within the RF coils).

BRIEF DESCRIPTION OF THE DRAWINGS

These as well as other objects and advantages of the invention will be more completely appreciated and understood by carefully reading the following detailed description of a presently preferred exemplary embodiment of the invention, taken in conjunction with the drawings, of which:

FIG. 5 is a overall isometric view of the entire quadrature RF coil structure;

DESCRIPTION OF THE PREFERRED EMBODIMENTS

Figure 1:
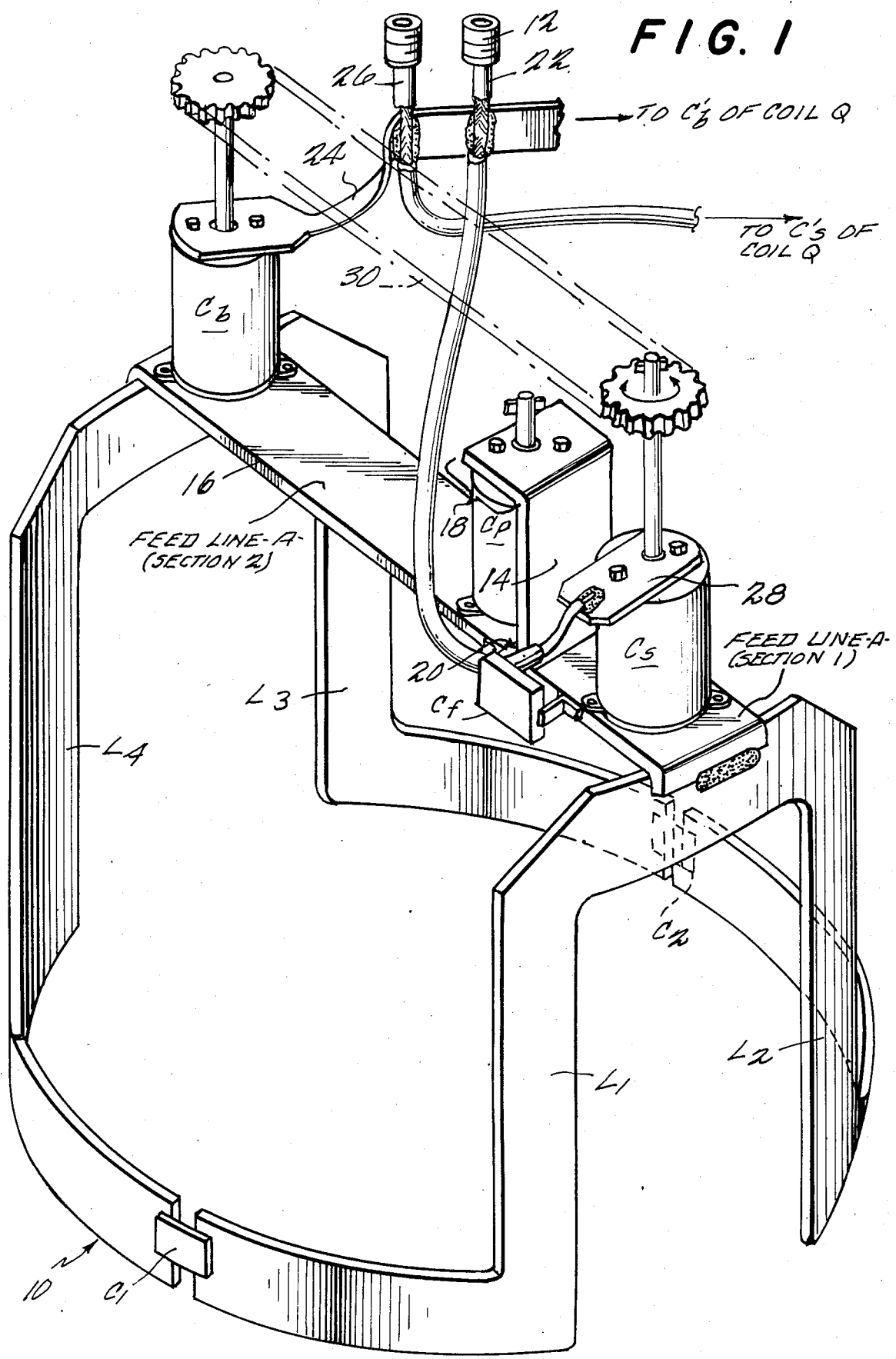
FIG. 1 is an exploded isometric view of the in-phase coil I and its associated feedline and coupling components.

An exemplary embodiment of an overall quadrature RF coil structure in accordance with this invention is depicted in FIG. 5. However, because the complete combined structure is fairly complex to show in one drawing and because it comprises two substantially identical sub-assemblies which are merely rotated by 90° with respect to one another (and, of course, separated by a thin layer of insulating material where necessary to avoid direct contact, the structure is more easily comprehended in the isometric view of but a single coil (e.g., the "in-phase" coil I) shown generally at 10 in FIG. 1. It is also helpful to simultaneously view FIG. 2 which shows a complete schematic diagram of the various components of a single coil structure (e.g., coil I). It will be noted, for example, that each of the circuit components in FIG. 2 bears a reference character or numeral which is also utilized to denote the corresponding physical structure in the isometric view of FIG. 1.

Figure 2:
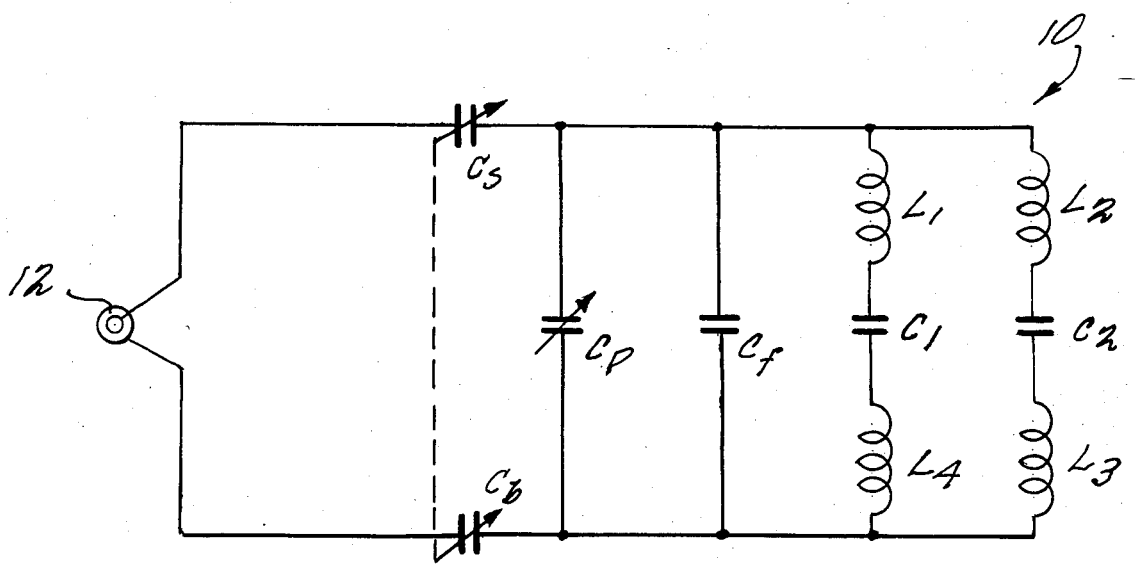
FIG. 2 is a electrical schematic diagram of the in-phase coil I structure.
Figure 4:
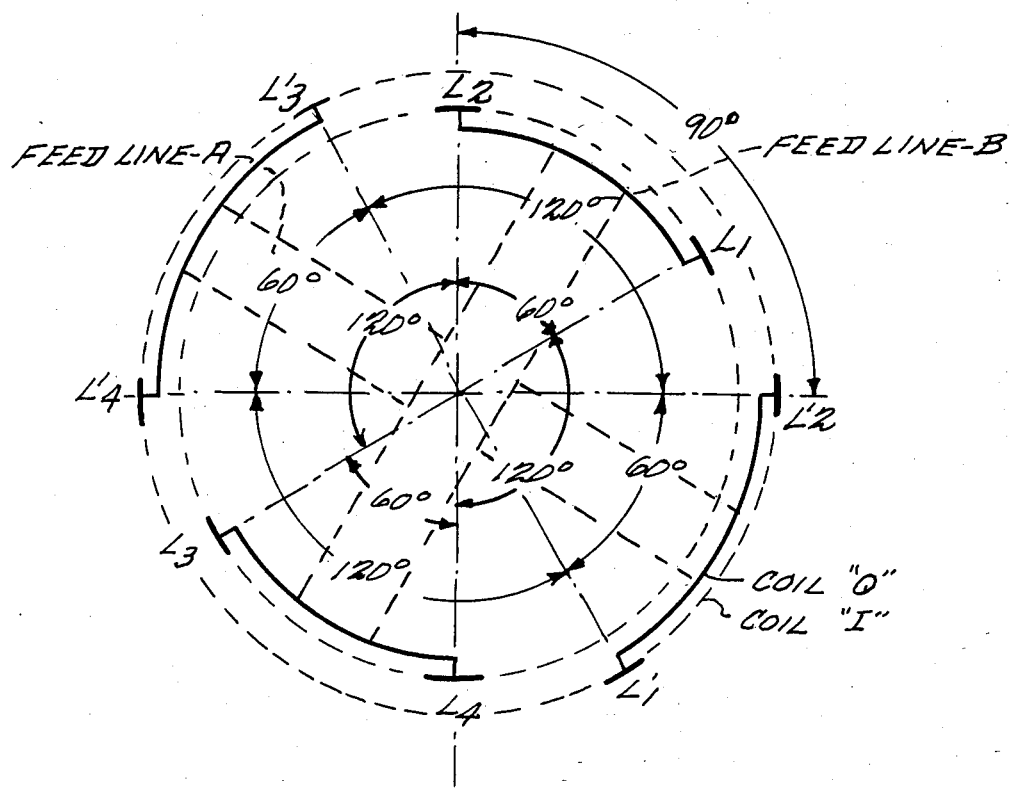
FIG. 4 is a schematic center section view of the complete quadrature coil structure showing the relative angular locations of the inductive legs of each coil and well as the relative locations of the perpendicular feedline structures.
Figure 6:
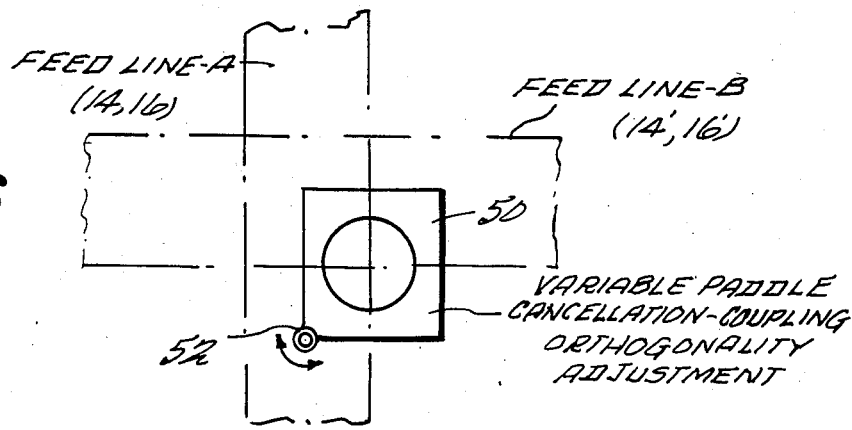
FIG. 6 is an isolated schematic view of the variable cancellation-coupling paddle which permits an orthogonality adjustment between the perpendicular feedline structures.

As depicted in FIG. 1, each of the RF coils includes four spaced-apart and generally parallel inductive leg sections $L_1$, $L_2$, $L_3$, and $L_4$. In the exemplary embodiment, these leg sections are disposed about the circumference of a generally cylindrical encompassed space into which an object to be imaged may be inserted through an open end of the coil structure (which is disposed toward the bottom of FIG. 1). As is depicted in FIG. 4, these legs are disposed at angular intervals of 60°, 120°, 60° and 120° in the exemplary embodiment. Typically, the axial length of the coil structure is chosen to be approximately one to two times the diameter.

As will be apparent to those in the art, coil I will sense (or produce in the transmitting mode) RF fields disposed within the enclosed volume having a first predetermined relative phase while the other coil Q (being rotated spatially by 90°) will sense (or produce in the transmit mode) RF fields within the same volume having a second relative phase, which second phase is orthogonal to the first phase.

The parallel inductive leg sections are electrically coupled together in an RF circuit by direct conductive connections between respective pairs (e.g., between $L_1$, $L_2$ and between $L_3$, $L_4$) and by capacitive coupling (e.g., $C_1$ and $C_2$ together with parallel tuning capacitance $C_p$ and $C_f$ together with series coupling capacitors $C_s$ and $C_b$) culminating in an RF transmission line termination such as a coaxial cable connector 12. As shown, the series coupling capacitors $C_s$ and $C_b$ are preferably variable and gang connected so as to maintain RF balance in the feedline structure. As also shown in the drawings, interconnections between leg portions are generally made by circumferentially extending segments at either end of the coil (and in conjunction with capacitors $C_1$ and $C_2$ at the open end of the coil).

The variable capacitors $C_s$, $C_p$ and $C_b$ are, in the exemplary embodiment, of the variable "piston" type where the capacitance is varied by rotation of a protruding shaft. The feedline structures which extend along a diagonal of the cylinder each include a first section 14 and a second section 16. As is perhaps best shown in FIG. 1, the first section 14 includes an axially off-set portion 18 and the other section 16 of the feedline extends with a terminal end 20 disposed opposite this axially off-set portion so as to facilitate the mounting of the parallel connected tuning capacitor $C_p$ therebetween. The fixed tuning capacitor $C_f$ is also conveniently connected across the terminal end 20 of the second section of feedline 16 and an inner (or lower as seen in FIG. 1) portion of the axially off-set of feedline section 14.

At the same time, the disposition of substantially aligned portions of the feedline sections 14, 16 at the radially outer ends permits a very convenient mounting of series coupling capacitors $C_s$ and $C_b$. As will be appreciated by those in the art, electrical connections to these coupling capacitors are made at either end of the generally cylindrical "can" structures of the "piston" type capacitors. Furthermore, the rest of the circuit to a standard transmission line (e.g., coaxial cable 22) may be very conveniently made by an additional bent copper strapping from series coupling capacitor $C_b$ which is soldered directly to the braid of coaxial cable 22 (and which is also soldered to the braid of a similar mated coaxial cable 26 associated with the other coil Q—and the copper strapping 24 continues on to the corresponding series coupling capacitor $C_b$ of coil Q). The center conductor of coaxial cable 22 then continues and is connected to a short copper strapping 28 connected to the outer terminal of series coupling capacitor $C_s$. This same arrangement also permits convenient ganging of series coupling capacitors $C_s$ and $C_b$ with a simple gear and chain or belt arrangement 30 as depicted in the drawings.

Figure 3:
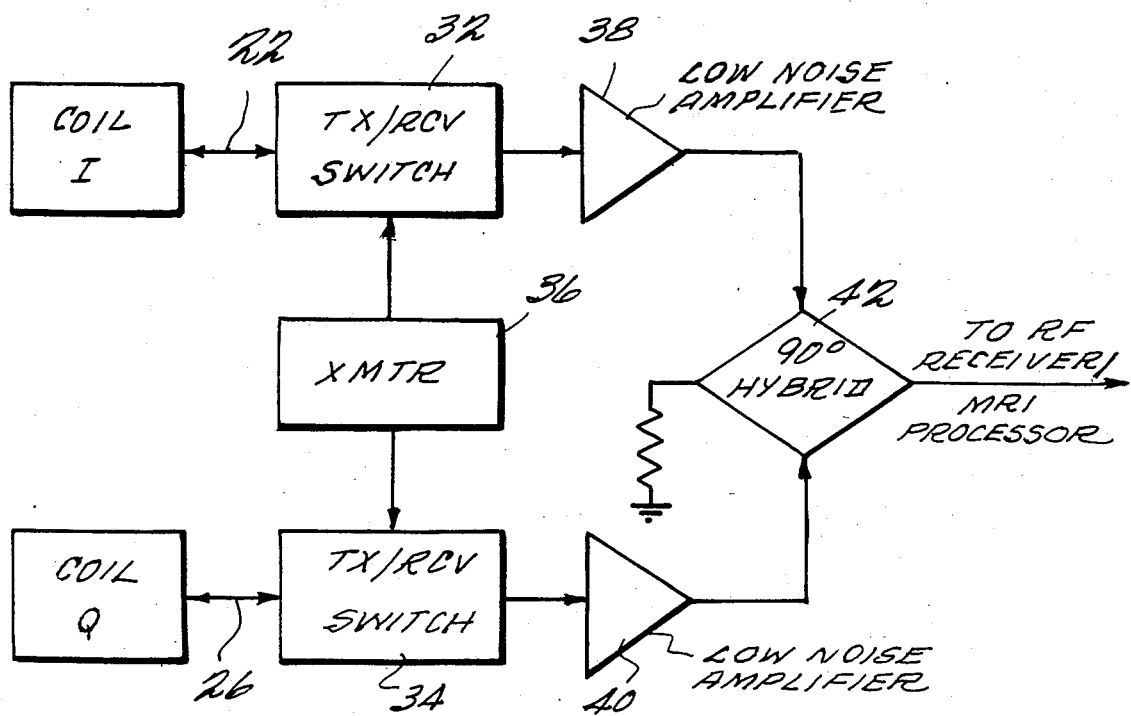
FIG. 3 is a schematic block diagram of the RF "front end" circuitry employed for coupling the in-phase coil I and the quadrature-phase coil Q through low-noise amplifiers and a 90° hybrid circuit to the RF receiver circuitry.

To further improve available signal-to-noise ratio, the "front end" RF coupling arrangement shown in FIG. 3 is preferred. Here, coils I and Q are respectively fed via conventional equal length transmission lines such as coaxial cables 22, 26. Conventional transmit receive switches 32, 34 cooperate with RF transmitter 36 as will be understood by those in the art. It will also understood that transmitter 36 may, if desired, be used only with one of the coils for the transmitting mode. If both coils are used in the transmitting mode, then a proper 90° phase shift must be made in signals transmitted via one of the coils to insure proper NMR excitation.

In the receive mode, signals received via coils I and Q are simply coupled directly through transmit/receive switches 32, 34. However, before combining such signals in a 90° hybrid circuit 42, they are preferably amplified by low noise RF amplifiers 38, 40. The 90° hybrid circuit 42 maybe of conventional design (e.g., Part No. JH-6-4 available from the Anzac Division of Adams -Russell Company, Inc., 80 Cambridge Street, Burlington, Mass. 01803). It will be understood by those in the art that the function of 90° hybrid circuit 42 is to combine signals emanating from coils I and Q with an appropriate 90° phase shift in one of the channels so as to produce a coherent combined RF output to the MRI RF receiver/processor for conventional MRI. It is believed that the use of amplification prior to combination in the 90° hybrid circuit provides further enhancement to the attainable signal-to-noise ratio.

Figure 7:
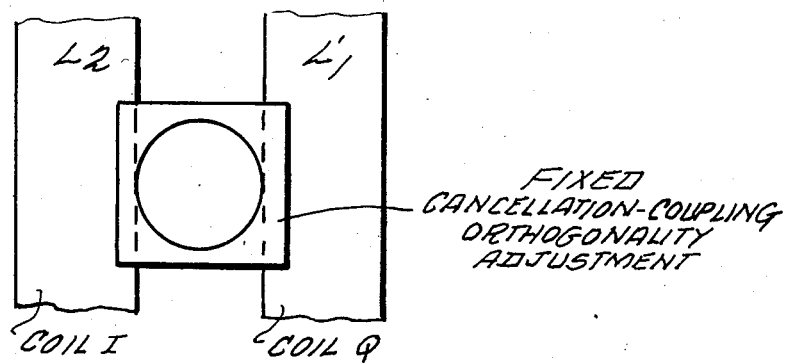
FIG. 7 is a partial schematic view of the fixed cancellation-coupling paddle which is placed so as to at least partially overlap a leg of each coil (albeit insulated therefrom to achieve a purely inductive/capacitive coupling) to "trim" and optimize the orthogonality relationship between the two coil structures.

To further enhance the electrical isolation of coils I and Q, a fixed cancellation-coupling "paddle" is empirically arranged to overlap (with a tape or other insulation mounting layer to prevent direct conductive contact) at least a portion of inductive legs from each of the coils and thus provide corrective cross-coupling between the coils of appropriate amplitude and phase so as to cancel the inherent and unwanted spurious coupling. In the preferred exemplary embodiment, the cancellation-coupling paddle is apertured as depicted in FIG. 7. In addition to the fixed cancellation-coupling paddle of FIG. 7, the exemplary embodiment includes a variable cancellation-coupling paddle 50 rotationally mounted via shaft 52 with respect to feedline structures A and B of coils I and Q respectively. The variable cancellation-coupling paddle 50 is thus inductively coupled to both the feedline structures A and B but movably mounted so as to vary the amount of such coupling as needed to cancel spurious inductive coupling between the feedline structures and/or between coils I and Q.

Although only one exemplary embodiment of this invention has been described in detail, those skilled in the art will recognize that many variations and modifications may be made in this embodiment while yet retaining many of the novel features and advantages of this invention. Accordingly, all such variations and modifications should be considered within the scope of the appended claims.

What is claimed is:

1. Magnetic resonance imaging apparatus having a quadrature RF coil comprising:
    first and second co-located RF coils extending axially and circumferentially about a volume to be imaged but being rotationally offset so as to produce a pair of RF signals from said volume which are in phase quadrature;
    said first and second RF coils having a common open end through which objects to be imaged may be inserted along an axis of the apparatus and a common closed end for location of RF coupling and feeding structures;
    said first and second RF coils each having respective RF feedlines which extend across respectively associated perpendicularly disposed diameters of said common closed end.

2. Magnetic resonace imaging apparatus as in claim 1 wherein said RF coils each comprise four leg sections extending axially and being angularly disposed at 60°, 120°, 60°, 120° locations along the circumference of a substantially common cylinder and wherein pairs of the legs are capacitively coupled together at said open end and alternate pairs of the legs are conductively coupled together at said closed end.

3. Magnetic resonance imaging apparatus as in claim 2 wherein said leg sections and said RF feedlines all comprise strips of conductive sheet material.

4. Magnetic resonance imaging apparatus as in claim 1, 2 or 3 wherein the feedline for each RF coil comprises:
    a first section shaped to include an axially offset portion;
    a second section extending along a diameter and terminating at a point disposed opposite said axially offset portion; and
    a tuning capacitor connected between said first and second sections at said axially offset portion.

5. Magnetic resonance imaging apparatus as in claim 4 wherein each RF coil comprises:
    a first series coupling capacitor mounted on said first section;
    a second series coupling capacitor mounted on said second section; and
    an RF transmission line connected to said first and second series coupling capacitors.

6. Magnetic resonance imaging apparatus as in claim 1 further comprising:
    a coupling paddle inductively coupled to both said feedline structures and movably mounted with respect thereto so as to vary the amount of such coupling needed to cancel spurious coupling therebetween.

7. Magnetic resonance imaging apparatus as in claim 6 further comprising:
    an apertured coupling paddle inductively coupled to and fixed in location over at least a portion of each of said RF coils.

8. Magnetic resonance imaging apparatus as in claim 1 further comprising:
    a first RF amplifier connected to amplify RF signals received by said first coil;
    a second RF amplifier connected to amplify RF signals received by said second coil;
    a 90° RF hybrid circuit connected to combine outputs from said first and second amplifiers into a common RF output; and
    an MRI receiver connected to receive and process said common RF output into an image of an object located within said RF coils.

9. A quadrature RF coil for use in magnetic resonance imaging (MRI) apparatus, said RF coil comprising:

a first RF coil for encompassing an object to be imaged by MRI and including four spaced-apart and generally parallel leg sections electrically coupled together in an RF circuit which, depending upon how it is used, senses or produces RF fields diposed therewithin having a first predetermined relative phase;

a first extended RF feedline structure electrically coupled to said first RF coil and extending perpendicular to the leg sections of the first RF coil and extending across one end thereof leaving the other end open for insertion of the object to be imaged;

a second RF coil co-located with and substantially encompassing the same space as the first RF coil, said second RF coil including four spaced-apart and generally parallel further leg sections electrically coupled together in an RF circuit which, depending upon how it is used, senses or produces RF fields disposed therewithin having a second predetermined relative phase which is orthogonal to said first phase; and a second extended RF feedline structure electrically coupled to said second RF coil and extending perpendicular to the further leg sections of the second RF coil and also extending across said one end of the co-located coils.

said first and second RF coils being of substantially identical structure but spatially rotated by 90° with respect to one another such that said first and second extended RF feedline structures are disposed at 90° with respect to one another.

10. A quadrature RF coil as in claim 9 wherein said leg sections and said further leg sections all extend axially along the circumference of a substantially common cylinder and wherein said first and second RF feedline structures are disposed along respective mutually orthogonal diameters of said cylinder.

11. A quadrature RF coil as in claim 9 wherein said leg sections, said further leg sections and said first and second RF feedline structures all comprise strips of conductive sheet material.

12. A quadrature RF coil as in claim 9 wherein each of said first and second coils include capacitors coupling said leg sections and feedline sections and wherein each of said extended feedline structures comprises:

a first section shaped to include an axially offset portion and having a first series coupling capacitor mounted thereto at one axial location and a parallel tuning capacitor connected thereto at a second axial location;

a second section extending in a straight line towards said first section and passing opposite its axially offset portion, said second section having a second series coupling capacitor mounted thereto at one location and having said parallel tuning capacitor mounted thereto at another location disposed under the axially offset portion of said first section.

13. A quadrature RF coil as in claim 9 further comprising:

an apertured coupling paddle inductively coupled to and fixed in location over at least a portion of (a) one of said legs of the first coil and (b) one of said further legs of the second coil for tending to cancel spurious coupling between said coils.

14. A quadrature RF coil as in claim 9 further comprising:

a coupling paddle inductively coupled to said feedline structures and movably mounted so as to vary the amount of such coupling needed to cancel spurious inductive coupling between said feedline structures or between said coils.

15. A magnetic resonance imaging apparatus including a quadrature RF coil as in claim 9 and further comprising:

a first RF amplifier connected to amplify RF signals received by said first coil;

a second RF amplifier connected to amplify RF signals received by said second coil; and a 90° RF hybrid circuit connected to coherently combine outputs from said first and second RF amplifiers and to produce a combined RF signal for use in the magnetic resonance imaging apparatus.

* * * * *

UNITED STATES PATENT AND TRADEMARK OFFICE
CERTIFICATE OF CORRECTION

PATENT NO. : 4,695,801

DATED : September 22, 1987

INVENTOR(S) : Mitsuaki Arakawa et al.

It is certified that error appears in the above-identified patent and that said Letters Patent is hereby corrected as shown below:

In the title, change "GUADRATURE" to read -- QUADRATURE --.

Column 3, line 30, "and" should read -- as --.

Column 5, line 10, after "also", insert -- be --.

In the drawing:

Figure 4, the leadline from the designation of Coil "Q" should be shortened to extend only to the outermost dotted circle comprising the primed inductances $L'_1$, $L'_2$, $L'_3$, and $L'_4$.

Signed and Sealed this

Twenty-sixth Day of April, 1988

Attest:

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO. : 4,695,801

DATED : September 22, 1987

INVENTOR(S) : Mitsuaki Arakawa et al.

It is certified that error appears in the above-identified patent and that said Letters Patent is hereby corrected as shown below:

In the title, change "GUADRATURE" to read — QUADRATURE —.

Column 3, line 30, "and" should read — as —.

Column 5, line 10, after "also", insert — be —.

In the drawing:

Figure 4, the leadline from the designation of Coil "Q" should be shortened to extend only to the outermost dotted circle comprising the primed inductances $L'_1$, $L'_2$, $L'_3$, and $L'_4$.

Figure 4, also extend the leadline from the designation of COIL "I" to the innermost dotted cirlce comprising the non-primed inductances $L_1$, $L_2$, $L_3$ and $L_4$.

This certificate supersedes certificate of April 26, 1988.

Signed and Sealed this

Twenty-eighth Day of June, 1988

Attest:

DONALD J. QUIGG

Attesting Officer     Commissioner of Patents and Trademarks